US008867584B2

(12) United States Patent
Dunn et al.

(10) Patent No.: US 8,867,584 B2
(45) Date of Patent: Oct. 21, 2014

(54) INTRA-CAVITY OPTICAL PARAMETRIC OSCILLATOR (75) Inventors: Malcolm H. Dunn, Fife (GB); David Stothard, Fife (GB)

(73) Assignee: University Court of the University of St Andrews, St Andrews (GB)

( * ) Notice: Subject to any disclaimer, the term of this patent is extended or adjusted under 35 U.S.C. 154(b) by 122 days.

(21) Appl. No.: 13/264,601

(22) PCT Filed: Apr. 13, 2010

(86) PCT No.: PCT/GB2010/000738
§ 371 (c)(1),
(2), (4) Date: Dec. 23, 2011

(87) PCT Pub. No.: WO2010/119242
PCT Pub. Date: Oct. 21, 2010

(65) Prior Publication Data
US 2012/0093179 A1 Apr. 19, 2012

(30) Foreign Application Priority Data

Apr. 15, 2009 (GB) .................................. 0906482.5

(51) Int. Cl.
H01S 3/08 (2006.01)
H01S 3/082 (2006.01)
(Continued)

(52) U.S. Cl.
CPC ............... *H01S 5/142* (2013.01); *H01S 3/0823* (2013.01); *H01S 3/1062* (2013.01); *H01S 5/041* (2013.01); *H01S 5/0604* (2013.01); *G02F 2001/392* (2013.01); *H01S 3/094053* (2013.01); *H01S 3/09415* (2013.01); *H01S 3/1083* (2013.01); *H01S 3/1673* (2013.01); *H01S 5/02484* (2013.01); *H01S 5/183* (2013.01); *H01S 3/1611* (2013.01); *H01S 3/0815* (2013.01); *H01S 3/08027* (2013.01); *H01S 3/08054* (2013.01)
USPC ............. 372/92; 372/21; 372/22; 372/29.022

(58) Field of Classification Search
USPC .................................. 372/21, 22, 29.022, 92
See application file for complete search history.

(56) References Cited

U.S. PATENT DOCUMENTS 3,947,780 A 3/1976 Rice et al.
4,079,339 A 3/1978 Kobayashi et al.
(Continued)

FOREIGN PATENT DOCUMENTS

EP 1478062 A2 11/2004
FR 2886745 A1 12/2006
(Continued)

OTHER PUBLICATIONS

Intellectual Property Office Search Report for Great Britain Application GB0906482.5 dated Aug. 4, 2009.
(Continued)

*Primary Examiner* — Dung Nguyen
(74) *Attorney, Agent, or Firm* — W. Kevin Ransom; Moore & Van Allen PLLC (57) ABSTRACT An optical parametric oscillator comprising: an optical cavity; a semiconductor gain-medium located within the optical cavity, such that together they form a semiconductor laser, and a nonlinear material located within the cavity such that the nonlinear material continuously generates down-converted idler- and signal-waves in response to a pump-wave continuously generated by the semiconductor gain-medium, wherein the pump wave is resonant within the optical cavity and one or other but not both of the down-converted waves is resonant within the pump wave cavity or a further optical cavity. Brewster plates ensure singly resonant optical parametric oscillators and a birefringent filer is used for frequency setting. Coupled cavities allow for setting the photon lifetime in the cavity that relaxation oscillations are prevented.

3 Claims, 6 Drawing Sheets

(51) Int. Cl.
*H01S 3/108* (2006.01)
*H01S 5/14* (2006.01)
*H01S 3/106* (2006.01)
*H01S 5/04* (2006.01)
*H01S 5/06* (2006.01)
*G02F 1/39* (2006.01)
*H01S 3/094* (2006.01)
*H01S 3/0941* (2006.01)
*H01S 3/16* (2006.01)
*H01S 5/024* (2006.01)
*H01S 5/183* (2006.01)
*H01S 3/081* (2006.01)

(56) References Cited

U.S. PATENT DOCUMENTS

| | | | |
|---|---|---|---|
| 5,206,867 | A | 4/1993 | Esterowitz et al. |
| 5,787,102 | A | 7/1998 | Alexander et al. |
| 5,796,761 | A | 8/1998 | Injeyan et al. |
| 6,130,900 | A | 10/2000 | Black et al. |
| 6,215,800 | B1 | 4/2001 | Komine |
| 7,339,718 | B1 | 3/2008 | Vodopyanov et al. |
| 2005/0078718 | A1 | 4/2005 | Spinelli et al. |
| 2005/0276285 | A1 | 12/2005 | Haung et al. |
| 2007/0291801 | A1 | 12/2007 | Caprara et al. |
| 2007/0297033 | A1 | 12/2007 | Kelley |
| 2010/0123901 | A1* | 5/2010 | Schwartz et al. ............ 356/460 |
| 2011/0116158 | A1* | 5/2011 | Dunn et al. ................. 359/330 |

FOREIGN PATENT DOCUMENTS

| | | |
|---|---|---|
| GB | 2333374 | 8/1998 |
| WO | WO 98/01927 A1 | 1/1998 |
| WO | WO 2006/010916 A2 | 2/2006 |
| WO | WO 2007/085859 A1 | 8/2007 |

OTHER PUBLICATIONS

Oshman et al.: "International optical parametric oscillators"; IEEE, J. Quantum Electronics QE-4, pp. 491-502 (1968).
W. Koechner: "Output fluctuations of CW-pumped Nd:YAG lasers"; IEEE Journal of Quantum Electronics QE-8(7), pp. 656-661 (1972).
Cui et al.: "Widely Tunable all-solid-state optical parametric oscillator for the visible and near infrared"; Optics Letters 18(2), pp. 122-124 (1993).
Zaibel et al.: "Relaxation oscillations in quasi-single-mode semiconductor lasers"; IEEE Journal of Quantum Electronics 3(9), pp. 2081-2086 (1994).
Colville et al.: "Continuous-wave, singly-resonant, inter-cavity parametric oscillator"; Optics Letters 22(2), pp. 75-77(1997).
Turnbull et al.: "Continuous-wave, singly-resonant intra-cavitiy optical parametric oscillator based on periodically- poled LiNbO3"; Electronics Letters 33(21), pp. 1817-1818 (1997).
D. J. M. Stothard et al.: "Low-pump-threshold continuous-wave singly resonant optical parametric oscillator"; Optics Letters 23, 1895-97 (1998).
Turnbull et al.: "Continuous-wave intracavity optical parametric oscillators: an analysis of power characteristics";Applied Physics B 66, pp. 701-710 (1998).
Dunn et al.: "Parametric generation of tunable light from continuous-wave to femtosecond pulses"; Science 286(5444), pp. 1513-1517 (1999).
M. Ebrahimzadeh: "Optical parametric devices and processes"; JOSA B 16(9), p. 1477 (1999).
Turnbull et al.: "Transient dynamics of CW intracavity singly resonant optical parametric oscillators"; IEEE, Journal of Quantum Electronics 35(11), pp. 1666-1672 (1999).
M. Ebrahimzadeh et al.: "Optical Parametric Oscillators"; Handbook of Optics (second edition), McGraw-Hill, vol. IV, 2001, Chapter 22.
Fix et al.: "Tunable ultraviolet optical parametric oscillator for differential absorption lidar measurements of tropospheric ozone"; Applied Physics B 75(2-3), pp. 153-163 (2002).
International Search Report for PCT/GB2010/000738 mailed Jul. 13, 2010.
M. Kenneth Oshman et al, "Theory of Optical Parametric Oscillation Internal to the Laser Cavity "; Journal of Quantum Electronics; vol. QE-4, No. 8; Aug. 8, 1968; pp. 491-502.
Thomas H. Jeys, "Suppression of laser spiking by intracavity second harmonic generation "; Applied Optics, vol. 30, No. 9; Mar. 20, 1991; pp. 1011-1013.
Thomas H. Jeys, "Suppression of Laser Spiking by Intracavity Second-Harmonic Generation "; Optical Society of America:1-55752-11-5/89; pp. 337-338.
D. H. Lee et al, "Self-injection-locking of a CW-OPO by intracavity frequency-doubling the idler wave "; Optics Express; vol. 5, No. 5; Aug. 30, 1999; pp. 114-119.
UK Search Report for GB0813980.0, dated Oct. 29, 2008.
International Search Report for PCT/GB2009/001871 dated Oct. 28, 2010.

* cited by examiner

INTRA-CAVITY OPTICAL PARAMETRIC OSCILLATOR

FIELD OF THE INVENTION

The present invention relates to continuous-wave singly resonant optical parametric oscillators and in particular continuous-wave singly resonant intra-cavity optical parametric oscillators.

BACKGROUND OF THE INVENTION

Optical parametric oscillators (OPOs) use parametric frequency conversion in a nonlinear material to convert input electromagnetic radiation of a short wavelength to tunable output electromagnetic radiation at longer wavelengths. The input electromagnetic wave is called the pump-wave and the two outputs thereby generated are typically called the signal-wave and the idler wave, by usual convention the wavelength of the signal-wave being the shorter of the two wavelengths. These two outputs when considered together are by convention referred to as the down-converted waves or the down-converted radiation. In this way, OPOs take a high-energy, i.e. short wavelength, photon and divide its energy between two newly generated lower-energy, i.e. longer wavelength, photons.

An optical parametric oscillator in general consists of an optically nonlinear material which is located appropriately within an optical cavity that (i) resonates either the signal-wave or the idler-wave (singly-resonant oscillator), or (ii) resonates both waves simultaneously (doubly-resonant oscillator). In this latter case, two cavities may be employed, one to resonate the signal-wave, the other to resonate the idler-wave. For singly resonant oscillators, usually the cavity has a low loss at the appropriate signal or idler wavelength, and the nonlinear material is phase-matched to efficiently generate light at the correct wavelength. An optical parametric oscillator has to be pumped by a wave or radiation from a pump-laser. The pump-laser in general has a gain-medium for generating the pump-wave. The gain-medium is usually incorporated within the optical cavity of the pump-laser that resonates the pump-wave. The gain-medium of the pump-laser generally has to be excited by some external source of power/energy, for example another laser, such as a diode-laser.

OPOs are flexible sources of coherent radiation that can be tuned over substantial bandwidths in the ultraviolet, visible, infrared and terahertz spectral regions. It will be appreciated that the generic term "optical" as used throughout is taken as embracing all of these spectral regions. Examples of OPOs are described in the articles "Continuous-wave, singly-resonant intra-cavity optical parametric oscillator based on periodically-poled LiNbO$_3$", by Turnbull et al, Electronics Letters 33(21), pages 1817-1818 (1997); "Widely Tunable all-solid-state optical parametric oscillator for the visible and near infrared" by Cui et al, Optics Letters 18(2), pages 122-124 (1993), and "Tunable ultraviolet optical parametric oscillator for differential absorption lidar measurements of tropospheric ozone" by Fix et al, Applied Physics B 75(2-3), pages 153-163 (2002).

OPOs have been operated on many timescales from the femtosecond pulse to the true continuous-wave. The advent of new nonlinear materials, in particular quasi-phase-matched nonlinear materials, has contributed significantly to these devices becoming practical sources. In quasi-phase-matched nonlinear materials the crystal domain structure is periodically reversed; by way of examples this being brought about either through periodic-poling, where the domains can be periodically reversed by applying a high voltage across the crystal through a patterned electrode, or through configurationally-oriented crystal growth. By varying the periodicity of the domain pattern in the crystal, the wavelengths of the signal-wave and idler-wave, which are phase-matched to a given pump wavelength, can be changed.

Despite the advent of quasi-phase-matched nonlinear materials, problems with the practicality of OPOs still exist, particularly in the case of continuous-wave devices. A particular problem, which restricts development of compact/miniature devices, is that substantial pump-wave intensities and hence pump-wave powers are required for the parametric oscillator to reach oscillation threshold. One solution to the high threshold problem is to put the optical parametric oscillator, and in particular the nonlinear material of the OPO, within the cavity of the pump-laser. Under the condition of the gain-medium of the pump-laser being able to deliver a given pump-wave power, the pump-wave intensity within the cavity of the pump-laser can be significantly higher, typically by factors greater the ten, than the pump-wave intensity that can be coupled out of the cavity, and therefore oscillation threshold can be reached with a much lower pump-wave power if the intra-cavity arrangement is employed. This type of device is known as an intra-cavity optical parametric oscillator. Such a device has been described by a number of authors, see in particular "Continuous-wave, singly-resonant, inter-cavity parametric oscillator" by Colville et al, Optics Letters 22(2), pages 75-77 (1997); "Optical parametric devices and processes" by Ebrahimzadeh, JOSA B 16(9), page 1477 (1999); "Parametric generation of tunable light from continuous-wave to femtosecond pulses" by Dunn et al, Science 286 (5444), pages 1513-1517 (1999), and "Internal optical parametric oscillators", by Oshman et al, IEEE, J. Quantum Electronics QE-4, pages 491-502 (1968).

Figure 1:
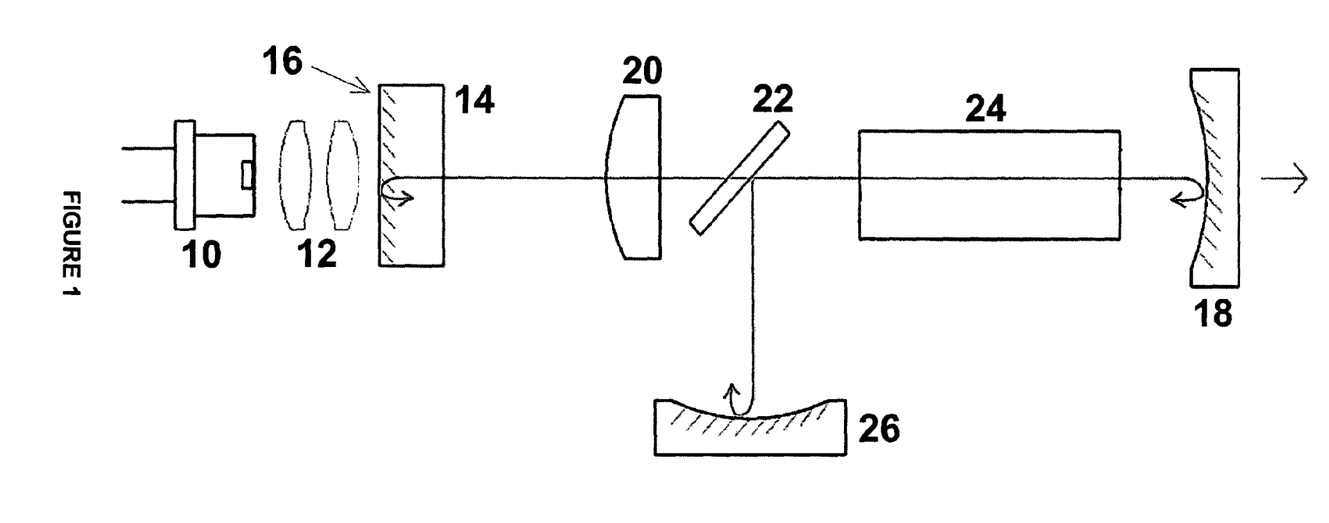
FIG. 1 shows an example of a known continuous-wave intra-cavity optical parametric oscillator.

FIG. 1 shows an example of a known continuous-wave intra-cavity optical parametric oscillator (see for example "Low-pump-threshold continuous-wave singly resonant optical parametric oscillator", D. J. M. Stothard, M. Ebrahimzadeh, and M. H. Dunn, Optics Letters 23, 1895-97 (1998)). This has a gain-medium 14 into which radiation from the semiconductor laser-diode 10 is directed by way of a lens arrangement 12 for the purpose of exciting the gain-medium. The lens 12 is provided for optimally matching the spatial profile of the radiation from the laser-diode 10 to the mode size, preferably the fundamental mode, of the radiation in the gain-medium 14. As a specific example, the laser gain-medium 14 is neodymium:vanadate, and the diode-laser 10 is adapted to deliver one watt of optical power at 809 nanometers, a wavelength at which there is a strong absorption feature associated with neodymium:vanadate.

On a back surface of the gain-medium 14, and integral with it, is a reflective material that defines a first mirror 16. Opposite the gain-medium 14 is a second reflective surface 18. Between the laser gain-medium 14 and the second reflective surface 18, and along an optical axis thereof, are in sequence a lens 20, a beam-splitter 22 and a nonlinear material 24, in this case a periodically poled lithium niobate (PPLN) crystal that is about 50 mm long and has a grating period of 29.3 microns. The purpose of the lens 20 is to enable the appropriate mode sizes to be obtained in the laser gain-medium 14 and the nonlinear material 24, when used in association with the first and second mirrors 16 and 18. Off the main optical axis is provided a third mirror 26, which is positioned so that light reflected from the beam-splitter 22 is directed onto it.

Each of the first and second mirrors 16 and 18, which define the cavity of the pump-laser, is highly reflective at the wavelength of the light, the pump-wave, emitted from the laser gain-medium 14. The beam splitter 22 is highly transmissive at the wavelength of the pump-wave so that it allows light emitted from the gain-medium 14 to pass through it and into the nonlinear material 24, whilst at the same time is highly reflective to down-converted waves emitted from the nonlinear material 24 so as to reflect such radiation either onto the third mirror 26 or back into the nonlinear material 24. A number of combinations of reflectivities of the second and third mirrors at the signal and idler wavelengths exist depending on which or both are the resonant waves. In this case, the second mirror 18 is wholly reflective at the signal wavelength, as well as at the pump wavelength as aforementioned, while being wholly transmissive at the idler wavelength so that an output can be gained. The third mirror 26 is wholly reflective to the down converted light, both at the signal-wave and idler-wave wavelengths, emitted from the nonlinear material. This configuration relates to a singly resonant OPO with regard to the down-converted waves, being resonant for the signal-wave only, and in which the idler-wave double passes the nonlinear medium. A number of variants on the above described particular design are possible while still retaining the concept of an intra-cavity OPO in which the OPO in whole or in part is located within the cavity of the pump-laser.

The arrangement of FIG. 1 has two coupled cavities, namely the cavity of the pump-laser defined by the optical path between the first and second mirrors 16 and 18, in which the nonlinear material 24 is located along with the gain-medium 14 of the pump-laser itself, and a second cavity, defined by the optical path between the second and third mirrors 18 and 26, in which the nonlinear material 24 is also located and which is associated with the resonant wave of the down-converted coherent radiation generated by this nonlinear material 24, and which is referred to previously as the cavity of the OPO. The two cavities are coupled through the nonlinear material 24.

When the arrangement of FIG. 1 is used, continuous stimulation of the nonlinear material 24 by radiation generated by the gain-medium 14 causes an optical parametric down conversion process to start and so generates a pair of continuous-wave signal- and idler-waves. In practice it has been found that the intensity stability of both the intra-cavity pump-field/wave and the intra-cavity signal/idler-field/wave are compromised when the parametric down conversion process is present extending over a range of timescales including: (i) oscillatory behaviour, with oscillation periods typically in the range $10^{-7}$ to $10^{-5}$ s; (ii) rapid growth coupled with slow decay of the envelope of oscillations, where damping times may exceed $10^{-3}$ seconds; and (iii) where the oscillations can become essentially continuous through being repeatedly triggered on timescales of the order of the damping time. This can be seen in FIG. 2, which shows the temporal profile of the intra-cavity pump-field recorded by a photodiode that has a response time that is significantly less than the oscillation period.

Figure 2:
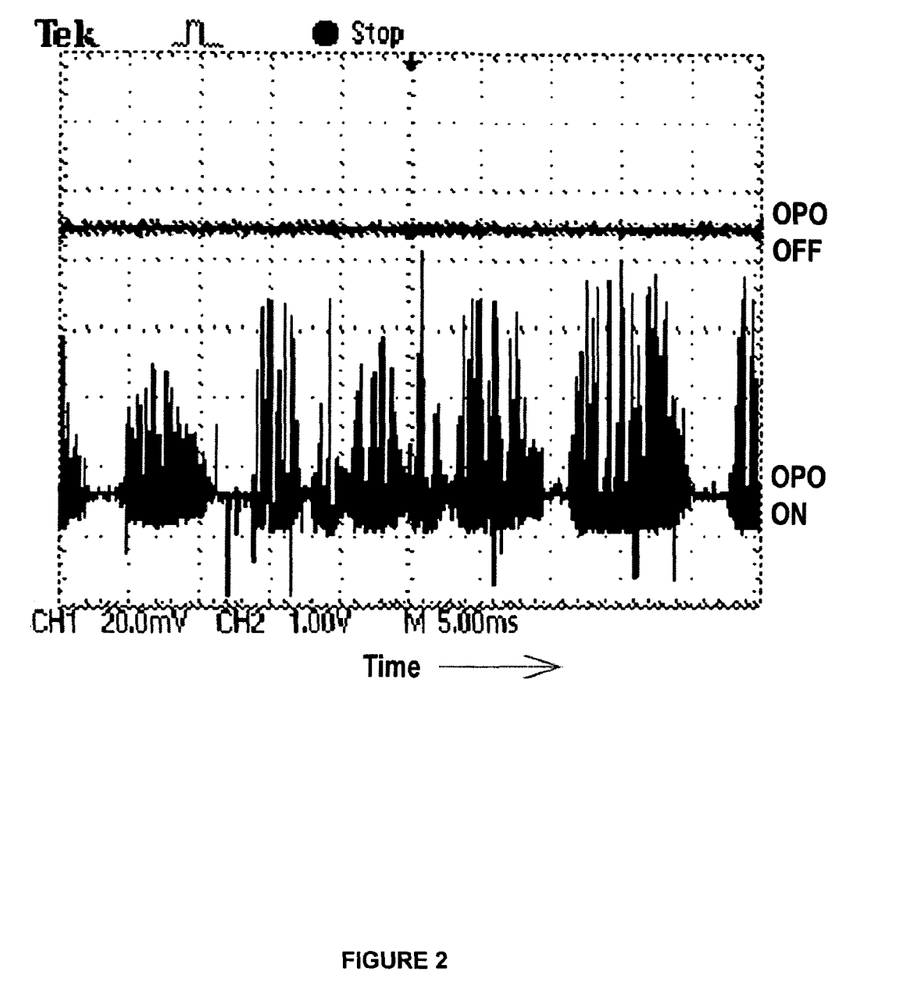
FIG. 2 depicts a temporal profile of the intra-cavity pump-field of the oscillator of FIG. 1.

Also shown in FIG. 2 is the intra-cavity pump-field when the down conversion process provided by the optical parametric oscillator is inhibited, for example, by placing a shutter between the beam-splitter 22 and the third mirror 26. In this case the pump-field exhibits stable operation. Hence, the inclusion of the intra-cavity parametric oscillator within the laser cavity significantly modifies the dynamics of the intra-cavity pump-field in the form of a relaxation oscillation type of behaviour, most notably the magnitude, period and decay time of these oscillations. The signal-field and the idler-field of the OPO exhibit similar effects.

As is well known, the occurrence of relaxation oscillations can prove detrimental to the operation of an intra-cavity continuous-wave optical parametric oscillator as a stable source in terms of both amplitude and frequency stability of the coherent radiation generated. This is discussed in the articles "Continuous-wave intracavity optical parametric oscillators: an analysis of power characteristics", by Turnbull et al, Applied Physics B 66, pages 701-710 (1998) and "Transient dynamics of CW intracavity singly resonant optical parametric oscillators", by Turnbull et al, IEEE, Journal of Quantum Electronics 35(11), pages 1666-1672 (1999).

Relaxation oscillations are widely known in laser devices. For example, such relaxations are widely known in the case of neodymium lasers and semiconductor lasers, see "Output fluctuations of CW-pumped Nd: YAG lasers", by Koechner, IEEE Journal of Quantum Electronics QE-8(7), pages 656-661 (1972), and "Relaxation oscillations in quasi-single-mode semiconductor lasers", by Zaibel et al, IEEE Journal of Quantum Electronics 3(9), pages 2081-2086 (1994).

In the case of intra-cavity optical parametric oscillators, where two coupled cavities are involved, the dynamics of the oscillatory behaviour is different in kind from that encountered in basic laser devices. By way of an illustration, the period of the oscillations in the intra-cavity OPO is determined pre-dominantly by the decay time of the pump-wave radiation within the passive cavity of the pump-laser or the decay time of the resonant signal/idler-wave radiation within the passive cavity of the OPO. It has been shown, both experimentally and theoretically, that the effects of relaxation oscillations are particularly severe for intra-cavity OPOs; see previous references to Turnbull et al. These relaxation oscillations can be triggered by many different mechanisms, for example thermal effects in the nonlinear medium and interferometric feedback. Thus, they present significant problems with regard to the operation of continuous-wave intra-cavity optical parametric oscillators.

As well as problems with relaxation oscillations, an OPO with a pump-laser based on a neodymium gain-medium, or indeed other solid state gain medium, faces a number of other drawbacks. For example, neodymium based pump-lasers exhibit the phenomenon of spatial hole burning which leads to a significant problem in obtaining single-frequency (single axial mode) oscillation when a standing-wave cavity is employed. Also, they lack flexibility with regard to spectral coverage, as the laser transitions are confined to the range 0.9 to 1.5 µm. Furthermore, they exhibit thermal lensing effects at higher powers, leading to stability and reliability problems, and have a restricted continuous tuning range for the down-converted waves, when done using continuous tuning of the pump-wave, due to their narrow gain bandwidth.

SUMMARY OF THE INVENTION

According to one aspect of the present invention, there is provided a continuous-wave intra-cavity optical parametric oscillator that has:
an optical cavity;
a semiconductor gain-medium located within the optical cavity, such that together they form a semiconductor laser, and
a nonlinear material located within the cavity such that the nonlinear material continuously generates down-converted idler- and signal-waves in response to a pump-wave continuously generated by the semiconductor gain-medium, wherein the pump wave is resonant within the optical cavity, and one or other but not both of the down-converted waves is resonant within the same or another optical cavity.

The semiconductor laser may be a semiconductor disc laser (SDL), for example a vertical external cavity semiconductor laser (VECSEL). The laser gain medium may be Titanium Sapphire. The semiconductor laser may be optically pumped, for example by a diode-laser.

Semiconductor materials have upper laser state lifetimes that are relatively small. In the absence of stimulated emission, their lifetimes are of the order of or less than the smaller of various lifetimes that are associated with continuous wave OPOs. In particular, the lifetimes of semiconductor materials are of the order of or less than the smaller of: (i) the lifetime of the pump radiation in the (passive) cavity of the pump-wave, or (ii) the lifetime of that component of the down-converted radiation that is resonant in the (passive) cavity of the OPO. The inventors have appreciated that fulfilling these criteria results in a continuous wave OPO in which relaxation oscillations are suppressed. Hence, by using a semiconductor gain medium as the pump source, there is provided a robust and reliable continuous wave singly resonant optical parametric oscillator. This is highly advantageous.

Operating a continuous-wave optical parametric oscillator within the cavity of a semiconductor laser provides numerous other advantages. For example, as a result of the broader gain bandwidths associated with semiconductor gain-media it extends the continuous tuning range of signal-wave and/or idler-wave frequencies associated with tuning the pump-wave frequency. It also enables an extended range of nonlinear materials to be accessed, as a result of the wide range of semiconductor gain-media available, thereby extending the frequency coverage of the generated signal/idler-waves to new spectral ranges. In addition, it can reduce thermal lensing so facilitating the use of higher pump powers, and eliminates spatial hole burning facilitating single-frequency oscillation. At the same time, advantages associated with intra-cavity OPOs are retained, in particular reduction in the pump power required to reach oscillation threshold, and so the ability to use diode-lasers as a source for exciting the gain-medium, and simplification of the optical geometry.

The conditions for relaxation oscillations to be heavily damped and hence absent can be determined from the cubic equation:

$$\alpha^3 + \frac{(1+k)}{\tau_u}\alpha^2 + \frac{k}{\tau_p}\left[\frac{(k+1)}{\tau_u} + \frac{1}{\tau_s}\right]\alpha + \frac{k(k+1)}{\tau_u \tau_s \tau_p} = 0$$

for the variable $\alpha$, where $\alpha$ may be written as the complex number:

$$\alpha = \alpha^r + i\alpha^i$$

when the conditions for the relaxation oscillations to be critically or greater than critically damped become:

$$\frac{\pi|\alpha^r|}{2|\alpha^i|} \geq 1,$$

with the requirement that $\alpha^r$ is negative. It should be appreciated that such extreme damping may not in practice be required for adequate suppression of relaxation oscillations.

In the above equation $\tau_u$, $\tau_p$, and $\tau_s$ are the characteristic decay times associated with the population in the upper laser level of the gain-medium, the pump-wave in the passive cavity of the pump-laser, and whichever of the signal-/idler-waves is resonant in the cavity of the OPO respectively. Also (1+k) is the number of times above OPO threshold that the intra-cavity OPO is excited by the primary pump source.

The above analysis applies only in the case when the threshold of the pump-laser itself has been adjusted for optimum down-conversion according to the standard and well-known criterion for intra-cavity OPOs (see for example Handbook of Optics (second edition), McGraw-Hill, Volume IV, 2001, Chapter 22 "Optical Parametric Oscillators" by M. Ebrahimzadeh and M. H. Dunn), and when the population in the lower laser level of the gain-medium is negligible. The above analysis could be extended to remove these aforesaid two restrictions.

The application of the above conditions during the design of the continuous-wave intra-cavity optical parametric oscillator means that relaxation oscillations can be eliminated and the output of the intra-cavity OPO can be made stable. This is advantageous.

The gain-medium of the semiconductor laser may be such that the lifetime of its upper laser state is of the order of or less than the smaller of: (i) the lifetime of the pump radiation in the (passive) cavity of the pump-laser, or (ii) the lifetime of the component of the down-converted radiation that is resonant in the (passive) cavity of the OPO.

The radiation decay time(s) associated with the passive cavity of the pump-laser and/or the passive cavity of the OPO may be: (a) of the order of the upper-state lifetime of the laser transition in the gain medium, or (b) greater than one-tenth of the upper-state lifetime of the laser transition, such that relaxation oscillations are adequately suppressed.

Means for clamping the spectral bandwidth over which the semiconductor laser oscillates. The means may comprise Brewster plates.

The pump wave may have a wavelength less than 3.5 µm; for example in the range 2.5 to 3.5 µm or in the range 2.0 to 2.5 µm or in the range 1.5 to 2.0 µm or in the range 0.5 to 1.5 µm or less than 0.5 µm. Alternatively, the pump laser may have a wavelength greater than 3.5 µm.

The frequency of one of the down-converted waves may be tunable over a range of wavelengths by tuning the pump-laser frequency alone.

The frequencies of both of the down-converted waves may be tunable over a range of wavelengths by tuning the pump-laser frequency in combination with tuning the frequency of only one of the down-converted waves.

According to another aspect of the invention there is provide a method for reducing significantly or eliminating relaxation oscillations in a singly resonant continuous wave intra-cavity OPO, the method comprising using a gain-medium for generating a pump wave in the intra-cavity OPO, the gain medium being such that the lifetime of its upper laser state, in the absence of stimulated emission, is of the order of or less than the smaller of: (i) the lifetime of the pump radiation in the (passive) cavity of the pump-laser, or (ii) the lifetime of that component of the down-converted radiation that is resonant in the (passive) cavity of the OPO.

BRIEF DESCRIPTION OF THE DRAWINGS

Various aspects of the invention will now be described by way of example only, and with reference to the accompanying drawings, of which.

DETAILED DESCRIPTION OF THE DRAWINGS

The present invention relates to a continuous-wave singly resonant intra-cavity optical parametric oscillator, in which the nonlinear medium of the optical parametric oscillator is located within the cavity of a semiconductor disk laser that acts as the pump-laser for the optical parametric oscillator. The oscillator is designed to reduce relaxation oscillations and maintain optimum down-conversion efficiency in the presence of a broad gain bandwidth pump-laser.

Relaxation oscillations can be reduced significantly or eliminated altogether provided that the gain-medium employed in the continuous-wave singly intra-cavity OPO is such that the lifetime of its upper laser state, in the absence of stimulated emission, is of the order of or less than the smaller of: (i) the lifetime of the pump radiation in the (passive) cavity of the pump-laser, or (ii) the lifetime of that component of the down-converted radiation that is resonant in the (passive) cavity of the OPO. An equation for deducing these criteria will be discussed in more detail later. The application of one or other of these criterion means that relaxation oscillations can be eliminated and the output of the intra-cavity OPO be made stable. Advantageously, this can be achieved simply and effectively by using a semiconductor disk laser SDL as the pump laser, for example a Vertical External Cavity Semiconductor Laser VECSEL.

Figure 3:
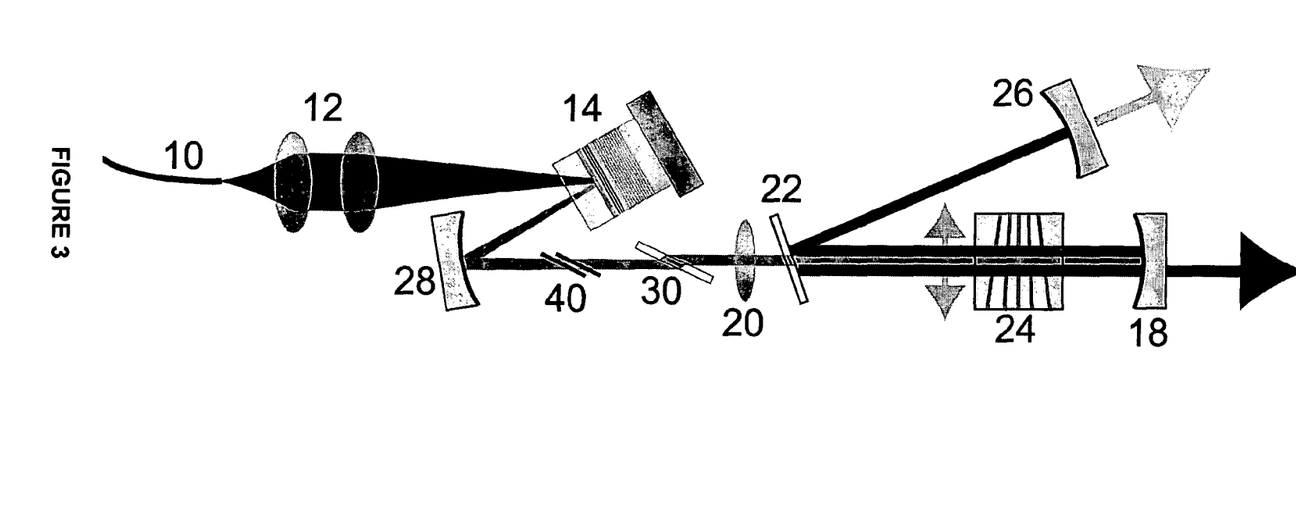
FIG. 3 is a schematic diagram of a continuous-wave intra-cavity OPO that has a semiconductor disc laser (SDL) as the pump laser.

FIG. 3 shows a continuous-wave optical parametric oscillator within the cavity of a semiconductor disk laser SDL. The SDL may be a Vertical External Cavity Semiconductor Laser (VECSEL), for example as is the case in the present embodiment an InGaAs VECSEL. The excitation source is a diode-laser 10, although any other suitable source could be used. The SDL chip is bonded to an uncoated diamond heat spreader through which it is excited and the circulating pump field propagates. The entire assembly is located in a brass annulus through which cooling water is circulated on the same circuit as the diode-laser 10 cooling block (not shown).

The SDL of FIG. 3 has a gain-medium into which radiation from the diode-laser 10 is directed by way of a pair of anti reflection coated aspheric lenses 12 that optimally match the spatial profile of the radiation from the diode-laser 10 to the mode size, preferably the fundamental mode, of the radiation in the gain-medium. The very broad absorption properties of the SDL gain media eliminate the need for accurate wavelength and temperature control of the diode-laser. The output from the source 10 is collimated and focused on the surface of the SDL active region via the lenses 12. Illumination by the diode-laser 10 causes the SDL to emit light from the same external surface on which radiation from the diode-laser is incident. This emitted light is used as the pump wave for the OPO. Formed within a substrate of the SDL is a Bragg high-reflector that is highly reflective at the output wavelength of the SDL.

Opposite the SDL and offset from the optical axis along which light from the diode-laser 10 is directed is a first reflective surface 28 that is positioned to direct light emitted from the SDL along the optical axis of an OPO. Opposite the first reflective surface 28 is a second reflective surface 18. Each of the first and second mirrors 28 and 18 is highly reflective at the pump-wavelength emitted from the SDL. The Bragg reflector and the highly reflecting mirrors 28, 18 form a high-finesse dogleg pump-laser cavity within which the pump wave emitted by the SDL is resonant.

Between the first and second reflective surfaces 28 and 18, and along an optical axis thereof, are in sequence two fused silica plates 40, a birefringent filter 30, a lens 20, a beam-splitter 22 and a nonlinear material 24. The lens 20 is chosen to allow the appropriate mode sizes to be obtained in the SDL and the nonlinear material 24, when used in association with the first and second mirrors 28 and 18.

The beam splitter 22, typically a dichroic beam splitter, is highly transmissive at the wavelength of the pump so that light emitted from the SDL passes through it and into the nonlinear material 24, whilst at the same time is highly reflective to down-converted waves emitted from the nonlinear material 24 so as to reflect such radiation either onto a third mirror 26 or back into the nonlinear material 24. Mirrors 18 and 26 form the signal-wave cavity. Both of these are broadband highly reflecting for the signal-wave. The signal wave is resonant within the signal-wave cavity. The resonant signal-wave can be output coupled from the OPO by reducing the reflectivity of one of the mirrors 18 or 26. Because this is a singly resonant device, the arrangement is such that the idler wave is non-resonant.

The nonlinear material 24 is a crystal that has a fanned grating design across its lateral dimension. The fanned grating design of the periodic polling enables rapid and wide tuning of the down-converted waves by lateral translation of the crystal through the pump-beam. To this end, the crystal is mounted on a precision computer-controlled translation stage (not shown) in order to facilitate automatic and repeatable tuning. The crystal is anti-reflection coated for the pump-, signal- and idler-waves.

The arrangement of FIG. 3 has two coupled cavities, namely the cavity of the pump-laser defined by the optical path between the first and second mirrors 28 and 18, in which the nonlinear material 24 is located along with SDL, and a second cavity, defined by the optical path between the second and third mirrors 18 and 26, in which the nonlinear material 24 is also located and which is associated with the resonant wave of the down-converted coherent radiation generated by the nonlinear material 24. The two cavities are coupled through the nonlinear material 24.

When continuously pumped by the SDL, the oscillator of FIG. 3 exceeds the oscillation threshold, i.e. the steady state gain of the gain medium exceeds the losses of the optical cavity. No components are included in the cavity for inducing pulsed behaviour and so the oscillator operates as a continuous wave singly resonant intracavity oscillator.

The two fused silica plates 40 and the birefringent filter 30 are provided for controlling the spectral profile. The birefringent filter (BRF) 30 is placed in the cavity at the Brewster angle. This defines both the polarization and operating wavelength of the pump-laser. Its presence narrows the pump-wave from the pump-laser to oscillate on a stable group of longitudinal modes located under a single pass-band of the étalon formed by the diamond heat spreader. In the case of a gain-medium where its gain bandwidth exceeds the phase-matching bandwidth of the intra-cavity nonlinear crystal, as is the case here with SDL and related lasers, means are required to clamp the wavelength of the pump-wave in the presence of parametric down-conversion, in this case, the two fused silica plates 40.

The system of FIG. 3 has been tested experimentally. In the tested arrangement, the SDL chip had an active region of typical thickness 1-2 μm and was bonded to a 500 μm thick uncoated diamond heat spreader that formed a 125 GHz étalon. The source 10 used was a fibre-coupled 808 nm diode-laser array capable of delivering up to 8.5 W output from a 100 μm core. The BRF 30 comprised a single, 4 mm thick, quartz plate. The laser was operated at a fixed wavelength of ~1050 nm, near the peak of the gain bandwidth. A 160 μm diameter beam-waist for the pump-wave was formed in the centre of the nonlinear crystal (NLC) 24 by an anti-reflection coated 38.1 mm focal length intra-cavity lens 20 and the end mirror 18. The non-linear crystal 24 used was a 30 mm long periodically-poled MgO:LiNbO$_3$ (PPLN). The dichroic beamsplitter (BS) 22 had a reflectivity of >99% at 1.45-1.6 μm. The signal-wave was output coupled from the OPO by reducing the reflectivity of mirror 18 and the idler-wave was output coupled by reducing the reflectivity of the mirror 26.

When the device of FIG. 3 is operated above OPO oscillation threshold, the nonlinear parametric down-conversion due to the intra-cavity OPO introduces a significant wavelength-dependant loss mechanism for the pump-laser. Under such circumstances the pump-laser can overcome the selectivity of the BRF 30 and hop wavelength to another mode of the diamond heat spreader étalon to such an extent that OPO operation is compromised. However, the presence of the two uncoated fused silica plates 40 in the pump-only section of the cavity in between mirror (M1) 28 and the BRF 30 substantially improves the selectivity of the BRF, clamping the pump-laser wavelength in the presence of the parametric output coupling effect. The effectiveness of the Brewster plates 40 in providing the required clamping is evident in FIG. 4, where the wavelength profile of the pump-laser before (dashed line) and after insertion of the Brewster plates 40 (heavy solid line) is shown, as well as the profile when the OPO is non-operative and in the absence of the Brewster plates 40 (fine black line).

Figure 4:
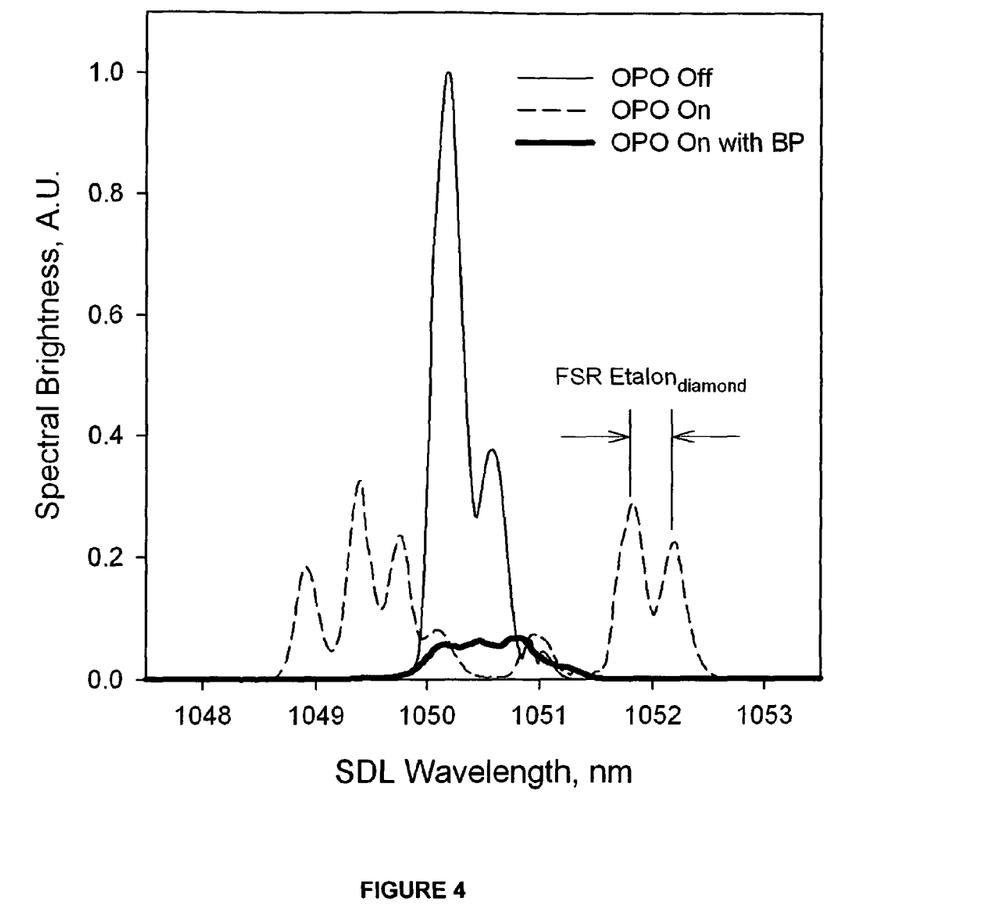
FIG. 4 shows the spectral profile of the pump-wave generated by the SDL as pump-laser.

As can be seen from FIG. 4, with the OPO non-operative and without plates 40 a narrow spectral profile centred round the wavelength 1050 nm is observed; this wavelength being selected using the birefringent filter (BRF). Operation of the OPO results in the spectral profile of the pump-wave extending outwards to cover from around 1049 to 1052 nm as the pump-laser re-adjusts across its broad gain bandwidth to minimise down-conversion loss (dashed black line); this being to the detriment of effective operation of the OPO. As can be seen from FIG. 4, this re-adjustment of the pump-wave profile is prevented by the inclusion of the Brewster plates 40 so as to maintain effective operation of the OPO.

The transient stability of the system of FIG. 3 was evaluated by perturbing the steady-state operating condition of the laser with an optical chopper located in the pump-wave only section of the cavity between the first mirror 28 and the BRF 30. The circulating pump field was monitored with a high-speed photodetector. The results are shown in FIG. 5(a).

Figure 5:
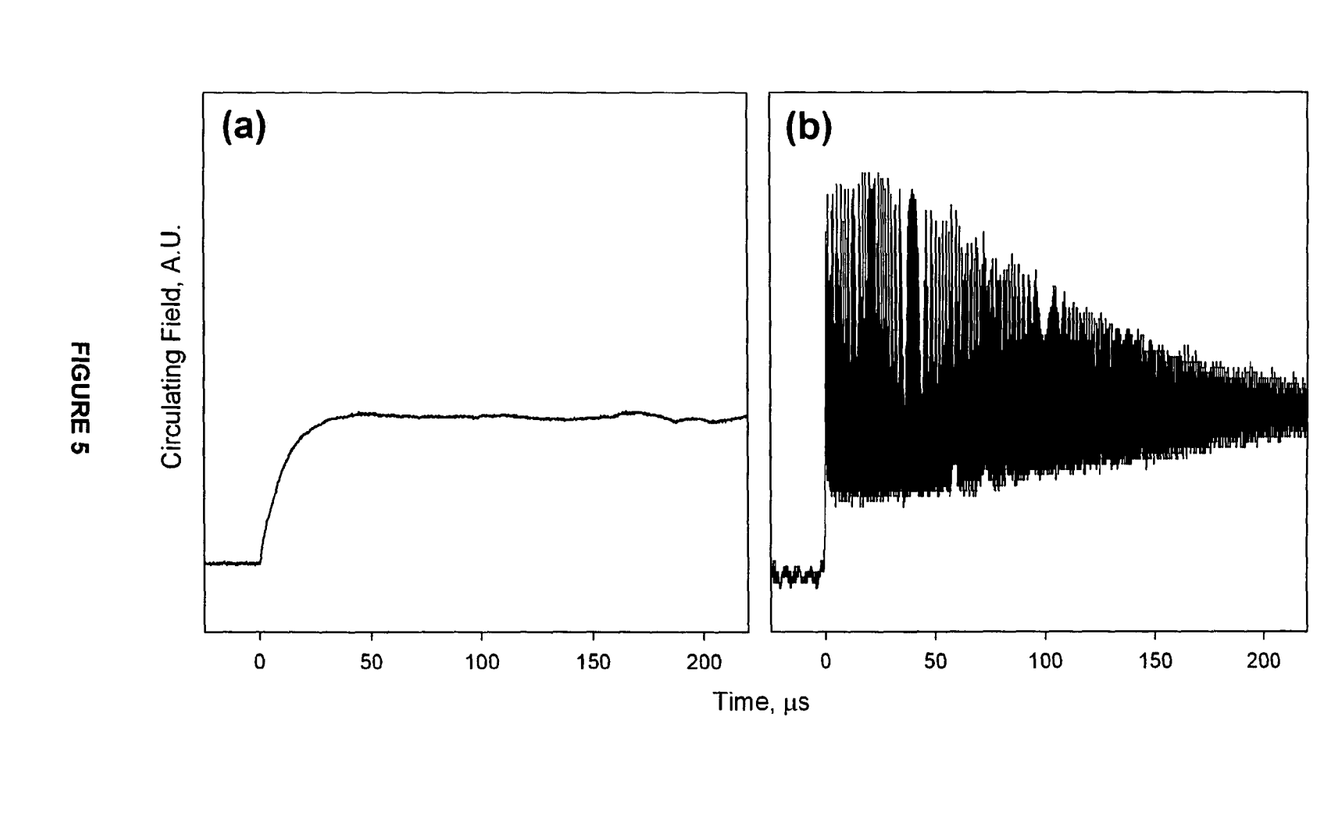
FIG. 5(a) shows the temporal profile exhibited by the pump-wave of the intra-cavity OPO of FIG. 3 when the OPO is switched on at time zero.
FIG. 5(b) shows the temporal profile of the pump-wave of the OPO of FIG. 3 when the SDL is replaced by a neodymium:vanadate based pump.

From FIG. 5(a), it can be seen that the upper laser state lifetime associated with the semiconductor gain-medium (1-10 ns) is shorter than the decay times of the resonant pump-wave and signal-wave in their respective cavities (40 ns), and so relaxation oscillations are absent and the steady-state condition is smoothly approached. The rising edge of the pump-field does not rise instantaneously as it tracks the rising cavity Q resulting from the finite speed of the chopping wheel. No traces of relaxation oscillation behaviour are evident, indicating the viability of the SDL/Intra-cavity OPO combination.

In contrast, FIG. 5(b) shows the temporal profile of the pump-wave of the OPO when the semiconductor gain-medium of the SDL is replaced by the gain-medium neodymium:vanadate with the other parameters of the intra-cavity OPO being essentially unchanged from the arrangement shown in FIG. 3. In this case, relaxation oscillations exhibiting deep modulation, high frequency and weak damping are now present. This is because the laser upper state lifetime associated with the neodymium ion is significantly longer than the decay times of the resonant radiations in the two cavities involved.

Figure 6:
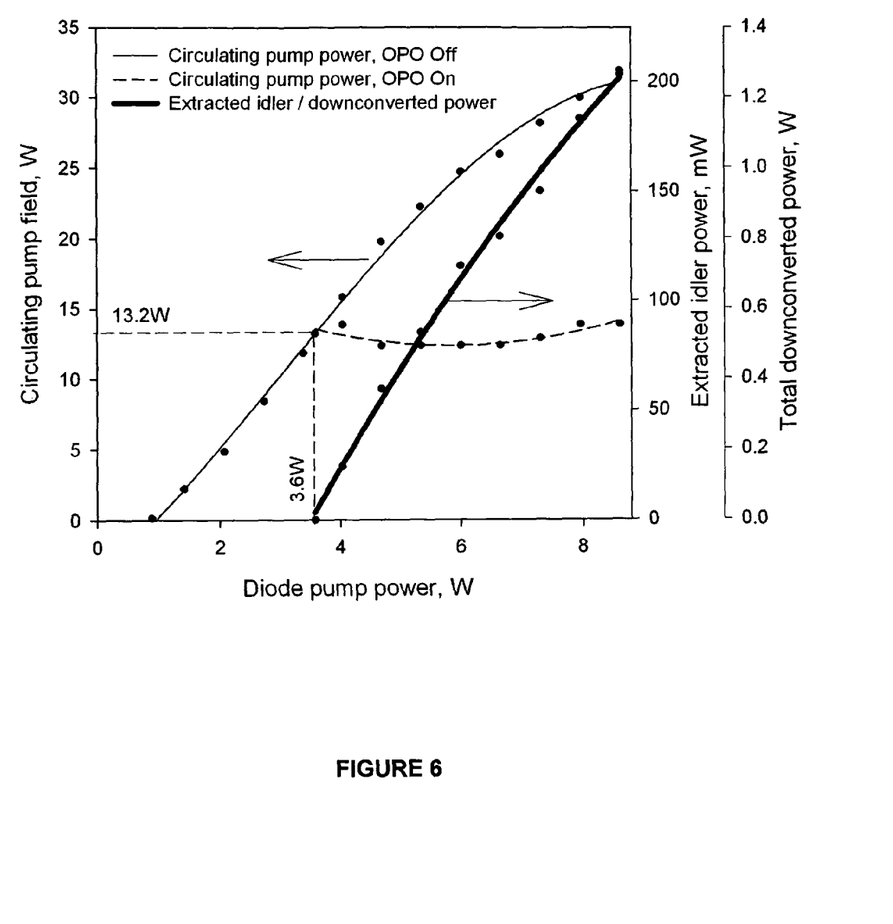
FIG. 6 shows the performance of the OPO as a function of the primary power from the diode-laser array used to excite the gain-medium of the SDL.

FIG. 6 shows typical down-conversion power characteristics of the intra-cavity OPO. In this case the device has been configured for (close-to) optimum down-conversion when the SDL gain-medium is pumped at 8.5 W by the diode-laser array used to excite the aforesaid gain medium. As well as the extracted (single-pass) idler-wave power obtained from the device, the total down-converted power (i.e. taking into account the dual-direction generation of the idler-wave and the signal/idler-wave quantum defect) is indicated. At a primary excitation power from the diode-laser array of 8.5 W, 205 mW of idler-wave at a wavelength of 3055 nm was obtained (in one direction only), corresponding to a total down-conversion power of 1.25 W. This is to be contrasted with the case where the pump-field is optimally output coupled from the cavity of the pump-laser by replacing mirror (M2) 18 with an optimal output coupler, with down-conversion now suppressed through misalignment of mirror (M3) 26, and with the SDL operating at the same primary excitation power of 8.5 W, when 1.5 W of pump radiation is extracted (at ~1050 nm) indicating a down-conversion efficiency for the OPO of 83%. By replacing the outboard signal-wave high-reflector 26 with a mirror, which exhibited 95% transmission for the signal-wave, output coupling of the signal-field was achieved. Under this condition, 323 mW of signal-wave at a wavelength of 1600 nm was obtained and the idler-wave power extracted through mirror 26 dropped from 205 to 110 mW.

Also shown in FIG. 6 is the power in the circulating pump-wave within the cavity of the pump-laser, where the case when parametric oscillation is suppressed (OPO Off, fine solid line)) is contrasted with the case when parametric oscillation is allowed (OPO On, dashed line)). These curves exhibit the classic performance anticipated for an intra-cavity OPO in that above OPO threshold the power of the circulating intra-cavity pump-wave is clamped to its value at OPO threshold. Such classic behaviour indicates the maintenance of stable cavity geometry as the pump power is increased, hence providing further evidence that thermal lensing effects in the gain medium are absent.

When designing a continuous wave singly resonant optical parametric oscillator, appropriate parameters can be selected to prevent relaxation oscillations. The solution of the following cubic equation:

$$\alpha^3 + \frac{(1+k)}{\tau_u}\alpha^2 + \frac{k}{\tau_p}\left[\frac{(k+1)}{\tau_u} + \frac{1}{\tau_s}\right]\alpha + \frac{k(k+1)}{\tau_u\tau_s\tau_p} = 0$$

for the variable α, where α may be written as the complex number: $\alpha=\alpha^r+i\alpha^i$, identifies the conditions for the relaxation oscillations to be critically-damped or greater than critically-damped and hence absent, namely that:

$$\frac{\pi |\alpha^r|}{2|\alpha^i|} \geq 1,$$

with the requirement that $\alpha^r$ is negative. It should be appreciated that such extreme damping may not in practice be required for adequate suppression of relaxation oscillations.

In the above equation $\tau_u$, $\tau_p$, and $\tau_s$ are the characteristic decay times associated with the population in the upper laser level of the gain-medium, the pump-wave in the passive cavity of the pump-laser, and whichever of the signal-/idler-waves is resonant in the cavity of the OPO respectively. Also (1+k) is the number of times above OPO threshold that the intra-cavity OPO is excited by the primary pump source.

The above analysis applies when the threshold of the pump-laser itself has been adjusted for optimum down-conversion according to the standard and well-known criterion for intra-cavity OPOs and when the population in the lower laser level of the gain-medium is negligible. However, the analysis could be extended to remove these restrictions. The above cubic equation may readily be solved by the use of a technical computing package such as "Mathematica".

In general terms, relaxation oscillations can be suppressed if the gain-medium of the semiconductor laser is such that the lifetime of its upper laser state is of the order of or less than the smaller of: (i) the lifetime of the pump radiation in the (passive) cavity of the pump-laser, or (ii) the lifetime of the component of the down-converted radiation that is resonant in the (passive) cavity of the OPO. Additionally or alternatively, the radiation decay time(s) associated with the passive cavity of the pump-laser and/or the passive cavity of the OPO may be arranged to be: (a) of the order of the upper-state lifetime of the laser transition in the gain medium, or (b) greater than one-tenth of the upper-state lifetime of the laser transition, such that relaxation oscillations are adequately suppressed.

The system of FIG. 3 is just one example of how the invention may be implemented. Variations of this are possible. For example, the resonant down-converted wave may be a single frequency (single axial mode) and be clamped in frequency, possibly by the use of an etalon, and where the pump-wave is also single frequency but means are provided to smoothly tune its frequency across the bandwidth of the SDL gain-medium, so resulting in the non-resonant wave being single frequency and being smoothly tuned across a range determined by the phase-match bandwidth of the non-linear medium.

Means may be provided for adjusting the phase-matching conditions within the nonlinear medium such that the non-resonant wave smoothly tunes across a range determined by the gain bandwidth of the gain-medium.

Means may be provided to hop the frequency of the resonant-wave from one axial mode to another so as to extend or otherwise modify the tuning range of the non-resonant wave.

Means may be provided wherein the pump-frequency is single frequency and clamped, and means are provided to smoothly tune the frequency of the resonant down converted wave while maintaining it as a single frequency wave, and where the resonant wave may be the signal-wave or the idler-wave.

Means may be provided in the case wherein the pump-wave is multi-frequency, to smoothly tune the frequency of the resonant wave while maintaining it as a single frequency wave and where the resonant wave may be the signal-wave or the idler-wave, and where the none resonant wave takes up the frequency differences between multi-frequency pump-wave and single-frequency resonant wave.

A skilled person will appreciate that variations of the disclosed arrangements are possible without departing from the invention. For example, although in FIG. 3 the signal-wave is described as being resonant, this may also be the case for the idler-wave. Also, the non-resonant down converted wave may be double-passed through the nonlinear medium. Means may be provided to vary the relative phasing between the pump-wave, signal-wave and idler-wave. Optionally, a travelling-wave (or ring) cavity may be used in place of the standing wave cavity of the resonant down-converted wave. It will also be apparent to a skilled person that the continuous-wave signal and/or idler-wave outputs from the device may be modulated in intensity or otherwise by the inclusion of a suitable modulator within one or other of the cavities of the device or by direct modulation of the primary pump power or otherwise, and that providing modulation periods exceed characteristic decay times associated with the cavities or the gain-medium, the advantages of the invention will be retained. Accordingly the above description of the specific embodiment is made by way of example only and not for the purposes of limitation. It will be clear to the skilled person that minor modifications may be made without significant changes to the operation described.

The invention claimed is:

1. A method for reducing relaxation oscillations in a singly-resonant continuous-wave intra-cavity optical parametric oscillator that has a gain-medium for generating a pump-wave within a pump-wave cavity and a nonlinear medium for generating a down-converted radiation, the method comprising:

selecting or modifying the gain-medium such that a lifetime $\tau_u$ of its upper laser state, in an absence of stimulated emission, is of an order equal to or less than a smaller of either:

(i) a lifetime $\tau_p$ of the pump-wave in the pump-wave cavity, or (ii) a lifetime $\tau_s$ of a component of the down-converted radiation that is resonant in a cavity of the optical parametric oscillator, and operating the intra-cavity optical parametric oscillator using the selected or modified gain-medium to thereby dampen relaxation oscillations, such that relaxation oscillations in the continuous-wave-singly resonate intra-cavity optical parametric oscillator are reduced.

2. A method as claimed in claim 1, wherein conditions for reducing relaxation oscillations are determined from a cubic equation:

$$\alpha^3 + \frac{(1+k)}{\tau_u}\alpha^2 + \frac{k}{\tau_p}\left[\frac{(k+1)}{\tau_u} + \frac{1}{\tau_s}\right]\alpha + \frac{k(k+1)}{\tau_u \tau_s \tau_p} = 0$$

for the variable $\alpha$, where $\alpha$ is written as:

$$\alpha = \alpha^r + i\alpha^i$$

wherein the conditions for the relaxation oscillations to be critically or greater than critically damped are:

$$\frac{\pi|\alpha^{ri}|}{2|\alpha^r|} \geq 1,$$

where $\alpha^r$ is negative.

3. A method for reducing relaxation oscillations in a singly-resonant continuous-wave intra-cavity optical parametric oscillator, the method comprising:

selecting or modifying a gain-medium in the intra-cavity optical parametric oscillator, the gain-medium being such that a lifetime $\tau_u$ of its upper laser state, in an absence of stimulated emission, is of an order equal to or less than a smaller of either:

(i) a lifetime $\tau_p$ of a pump-wave in the pump-wave cavity, or (ii) a lifetime $\tau_s$ of a component of a down-converted radiation that is resonant in a cavity of the optical parametric oscillator, such that relaxation oscillations in a continuous-wave-singly resonant intra-cavity optical parametric oscillator are reduced; and using the gain-medium for generating a pump-wave within a pump-wave cavity and a nonlinear medium for generating a down-converted radiation.

* * * * *